(12) United States Patent
Rathor et al.

(10) Patent No.: US 8,093,698 B2
(45) Date of Patent: Jan. 10, 2012

(54) GETTERING/STOP LAYER FOR PREVENTION OF REDUCTION OF INSULATING OXIDE IN METAL-INSULATOR-METAL DEVICE

(75) Inventors: Manuj Rathor, Milpitas, CA (US); Matthew Buynoski, Palo Alto, CA (US); Joffre F. Bernard, Santa Clara, CA (US); Steven Avanzino, Cupertino, CA (US); Suzette K. Pangrle, Cupertino, CA (US)

(73) Assignee: Spansion LLC, Sunnyvale, CA (US)

( * ) Notice: Subject to any disclaimer, the term of this patent is extended or adjusted under 35 U.S.C. 154(b) by 243 days.

(21) Appl. No.: 11/633,844

(22) Filed: Dec. 5, 2006

(65) Prior Publication Data

US 2008/0130195 A1   Jun. 5, 2008

(51) Int. Cl.
*H01G 4/224* (2006.01)
(52) U.S. Cl. ............... 257/682; 257/295; 257/E21.009; 257/E21.021; 257/E21.104; 257/E21.425; 257/E21.43; 257/E21.664
(58) Field of Classification Search .......... 257/303–306, 257/311, 532, 535, 913, 915, E27.048, E29.343
See application file for complete search history.

(56) References Cited

U.S. PATENT DOCUMENTS

| | | | | |
|---|---|---|---|---|
| 5,155,094 A * | 10/1992 | Okabe et al. | .................. | 505/190 |
| 6,072,689 A * | 6/2000 | Kirlin | .......................... | 361/311 |
| 6,121,648 A * | 9/2000 | Evans, Jr. | ...................... | 257/295 |
| 6,184,927 B1 * | 2/2001 | Kang | ........................ | 348/240.99 |
| 6,249,014 B1 * | 6/2001 | Bailey | ............................ | 257/295 |
| 6,512,256 B1 * | 1/2003 | Cuchiaro et al. | .............. | 257/295 |
| 6,570,202 B2 * | 5/2003 | Cuchiaro et al. | .............. | 257/295 |
| 6,611,014 B1 * | 8/2003 | Kanaya et al. | ................ | 257/295 |
| 6,759,326 B2 * | 7/2004 | Siegel et al. | .................. | 438/642 |
| 6,762,446 B2 * | 7/2004 | Amiotti et al. | ................. | 257/296 |
| 7,067,862 B2 * | 6/2006 | Rinerson et al. | ............. | 257/295 |
| 7,129,580 B1 * | 10/2006 | Londergan et al. | .......... | 257/751 |
| 7,504,684 B2 * | 3/2009 | Kanaya | ....................... | 257/300 |
| 2001/0010377 A1 * | 8/2001 | Cuchiaro et al. | ............. | 257/295 |
| 2003/0136989 A1 * | 7/2003 | Amiotti et al. | ................ | 257/296 |
| 2004/0004793 A1 * | 1/2004 | Mikawa et al. | ................ | 361/15 |
| 2004/0106001 A1 * | 6/2004 | Kovacs et al. | ................ | 428/670 |
| 2005/0276099 A1 * | 12/2005 | Horng et al. | .................. | 365/158 |
| 2006/0008965 A1 * | 1/2006 | Aggarwal et al. | ............ | 438/200 |
| 2006/0073614 A1 * | 4/2006 | Hara | ................................. | 438/3 |
| 2006/0157762 A1 * | 7/2006 | Hikosaka et al. | ............ | 257/295 |
| 2006/0286448 A1 * | 12/2006 | Snyder et al. | ................. | 429/176 |
| 2007/0210431 A1 * | 9/2007 | Amiottis | ....................... | 257/682 |

* cited by examiner

*Primary Examiner* — Victor A Mandala
*Assistant Examiner* — William Harriston

(57) ABSTRACT

An electronic device includes a first electrode, a second electrode and an insulating layer between the first and second electrodes, which insulating layer may be susceptible to reduction by $H_2$. A gettering layer is provided on and in contact with the first electrode, the gettering layer acting as a protective layer for substantially avoiding reduction of the insulating layer by capturing and immobilizing $H_2$. A glue layer may be provided between the gettering layer and first electrode. An additional gettering layer may be provided on and in contact with the second electrode, and a glue layer may be provided between the second electrode and additional gettering layer.

15 Claims, 5 Drawing Sheets

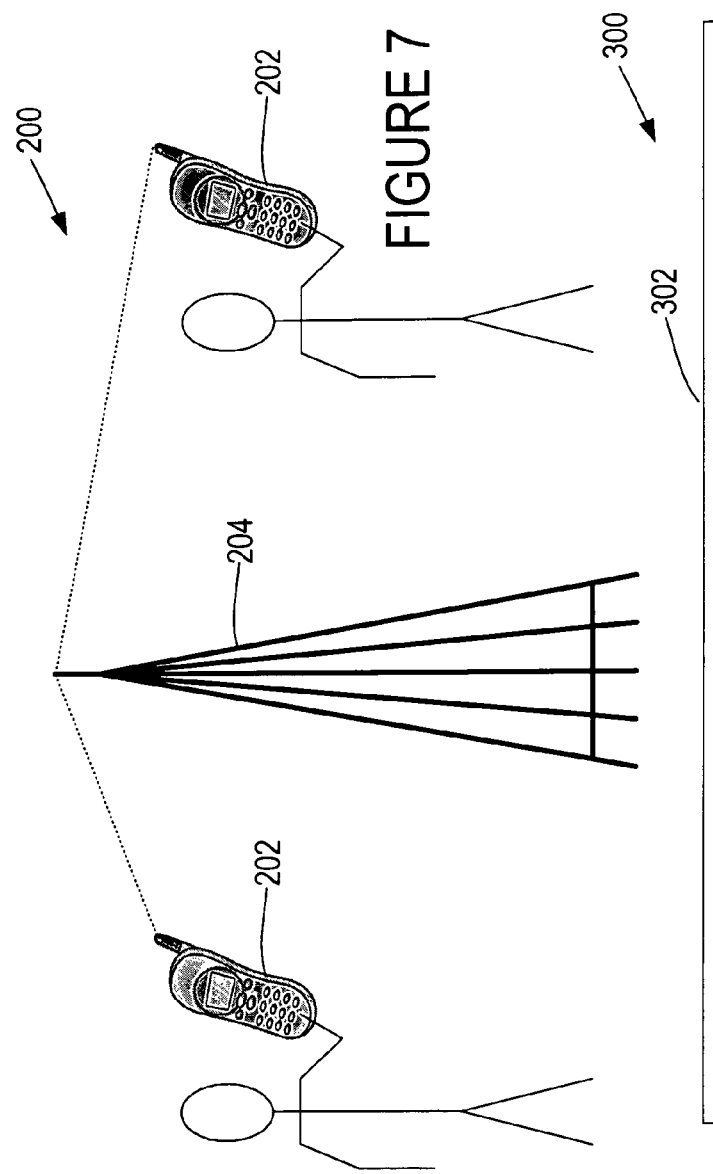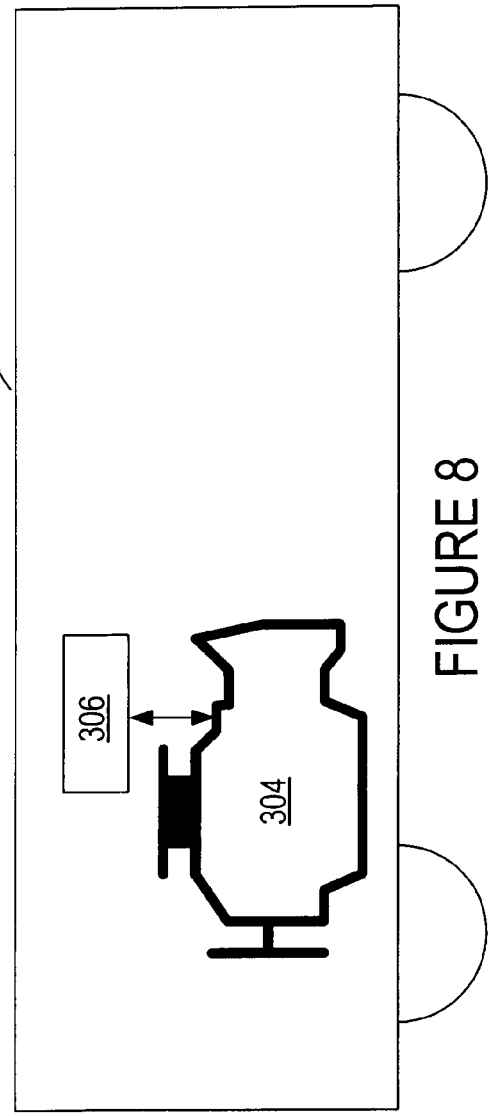

GETTERING/STOP LAYER FOR PREVENTION OF REDUCTION OF INSULATING OXIDE IN METAL-INSULATOR-METAL DEVICE

BACKGROUND OF THE INVENTION

1. Technical Field

This invention relates generally to Metal-Insulator-Metal devices, and more particularly, to an approach for avoiding undesired reduction of the insulating layer thereof.

2. Background Art

FIG. 1 illustrates a two-terminal metal-insulator-metal (MIM) resistive memory device 30. The memory device 30 includes a metal, for example copper electrode 32, an active insulating layer 34, for example copper oxide on and in contact with the electrode 32 (or a multilayer oxide stack if so chosen), and a metal, for example copper electrode 36 on and in contact with the active layer 34 (the electrodes may be of different materials if chosen). With reference to FIG. 5, initially, assuming that the memory device 30 is unprogrammed, in order to program the memory device 30, ground is applied to the electrode 32, while a positive voltage is applied to electrode 36, so that an electrical potential $V_{pg}$ (the "programming" electrical potential) is applied across the memory device 30 from a higher to a lower electrical potential in the direction from electrode 36 to electrode 32. Upon removal of such potential the memory device 30 remains in a conductive or low-resistance state having an ON-state resistance.

In the read step of the memory device 30 in its programmed (conductive) state, an electrical potential $V_r$ (the "read" electrical potential) is applied across the memory device 30 from a higher to a lower electrical potential in the direction from electrode 36 to electrode 32. This electrical potential is less than the electrical potential $V_{pg}$ applied across the memory device 30 for programming (see above). In this situation, the memory device 30 will readily conduct current, which indicates that the memory device 30 is in its programmed state.

In order to erase the memory device 30, a positive voltage is applied to the electrode 32, while the electrode 36 is held at ground, so that an electrical potential $V_{er}$ (the "erase" electrical potential) is applied across the memory device 30 from a higher to a lower electrical potential in the direction of from electrode 32 to electrode 36. Depending on the embodiment, the memory device 30 may be erased by applying an electrical potential across the memory device from higher to lower potential in the direction from the electrode 36 to the electrode 32, i.e., the same direction as the programming potential.

In the read step of the memory device 30 in its erased (substantially non-conductive) state, the electrical potential $V_r$ is again applied across the memory device 30 from a higher to a lower electrical potential in the direction from electrode 36 to electrode 32 as described above. With the active layer 34 (and memory device 30) in a high-resistance or substantially non-conductive OFF state, the memory device 30 will not conduct significant current, which indicates that the memory device 30 is in its erased state.

The insulating layer typically takes the form of a thin oxide layer film (for example copper oxide, $CuO_x$, described above) or a stack of multilayer multiple thin oxide films. Many of these oxide films have low free energy of formation and thus may be readily reduced by $H_2$. This $H_2$ may arise as a by-product in process steps that follow the formation of the MIM stack, or may be released from ILD (Interlayer Dielectric) or passivation silicon nitride (both of which are excellent reservoirs of hydrogen), during a high temperature thermal cycle. This undesired reduction of the oxide layer(s) results in degradation thereof, in turn causing degradation in performance of the resulting device.

Therefore, what is needed is an approach where ambient $H_2$ is kept from attacking the oxide film(s), so that undesired reduction of thereof is avoided.

DISCLOSURE OF THE INVENTION

Broadly stated, the present electronic device comprises a first electrode, a second electrode, an insulating layer between the first and second electrodes, and a protective body for substantially avoiding reduction of the insulating layer.

The present invention is better understood upon consideration of the detailed description below, in conjunction with the accompanying drawings. As will become readily apparent to those skilled in the art from the following description, there are shown and described embodiments of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of illustrative embodiments when read in conjunction with the accompanying drawings, wherein:

FIGS. 7-9 are systems incorporating memory devices of the present type.

BEST MODE(S) FOR CARRYING OUT THE INVENTION

Reference is now made in detail to specific embodiments of the present invention which illustrate the best mode presently contemplated by the inventors for practicing the invention.

Figure 1:
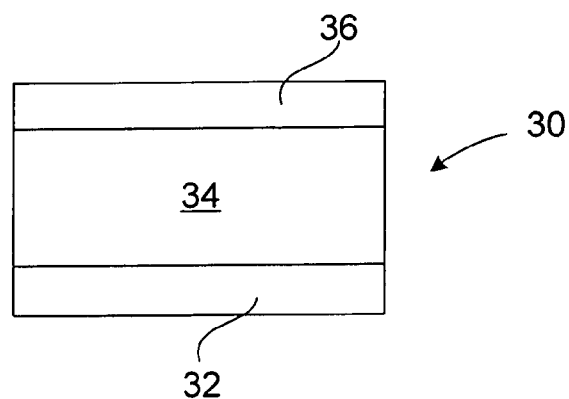
FIG. 1 is a cross-sectional view of an above-described memory device.
Figure 2:
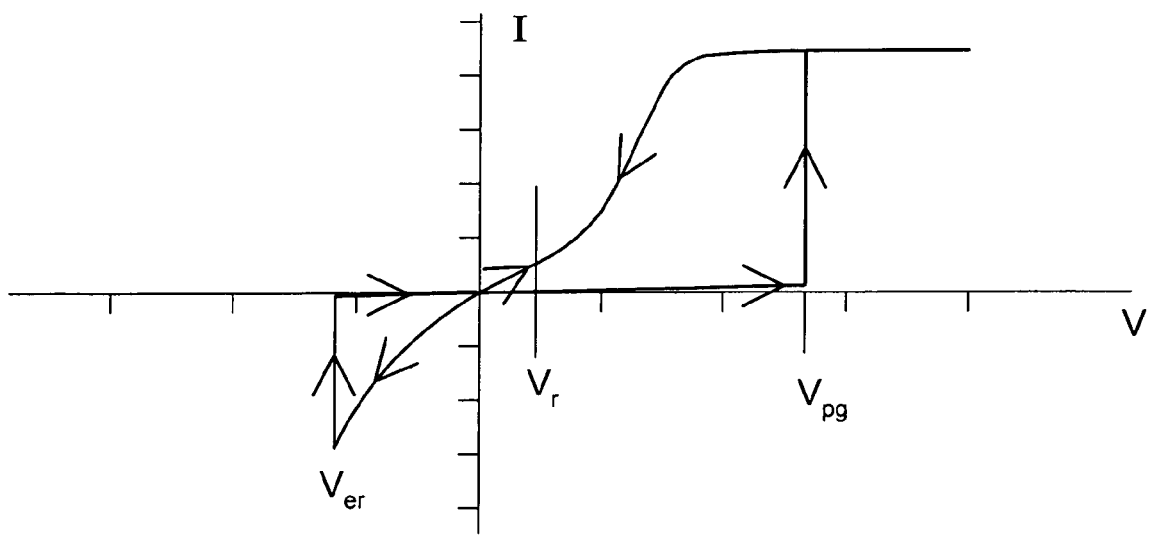
FIG. 2 is a plot of current vs. voltage illustrating operating characteristics of the memory device of FIG. 1.
Figure 3:
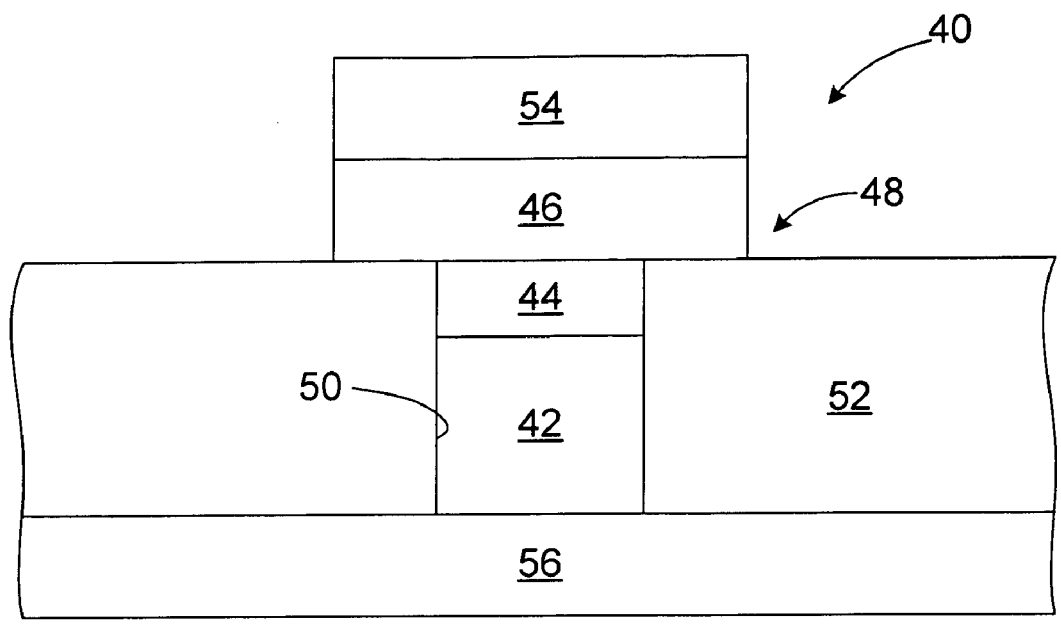
FIG. 3 illustrates a first embodiment of the invention.

FIG. 3 illustrates a first embodiment of the invention. Similar to the prior art memory device 30, the structure 40 includes an electrode 42, an insulating layer 44 on and in contact with the electrode 42, and an electrode 46 on and in contact with the insulating layer 44, so that insulating layer 44 lies between the electrodes 42, 46, the electrode, insulating layer and electrode forming a metal-insulator-metal (MIM) resistive memory device 48. The insulating layer 44 and electrode 42 are formed within an opening 50 in a dielectric layer 52, and the electrode 46 is formed over the insulating layer 44 and dielectric layer 52. The electrodes 42, 46 may be of any suitable conductive material, for example Cu, Ta, Ti, TiN, TaN, Co, a-Si, etc., while the insulating layer 44 may be of any suitable metal oxide film, for example $CuO_x$, $TiO_x$, $CoO_x$, $Ta_xO_y$, $HfO_x$, HfSiOn, etc., which may be susceptible to reduction by $H_2$. The thickness of the oxide film 44 may be for example 20-500 angstroms. It will be understood that the insulating layer 44 may be made up of a stack of oxide layers if so chosen. At the top of the metal-insulator-metal device 48 on and in contact with the electrode 46 is an $H_2$ gettering layer 54 of Ti. At the bottom of the metal-insulator-metal device 48 is an additional $H_2$ gettering layer 56, also of Ti, with the electrode 42 on and in contact with that $H_2$ gettering layer 56. The gettering layers 54, 56 may be for example 100-1000 angstroms thick. In the event that $H_2$ is released as a byproduct in process steps that follow formation of the MIM 48, or from interlayer dielectric or passivation silicon nitride (SiN) (not shown) in which the $H_2$ is stored, during a high temperature thermal cycle, each gettering layer 54, 56 acts as a protective layer for the oxide layer 44, capturing and immobilizing $H_2$ within itself, so that the oxide layer 44 is protected from attack (and undesired reduction) by the $H_2$.

Figure 4:
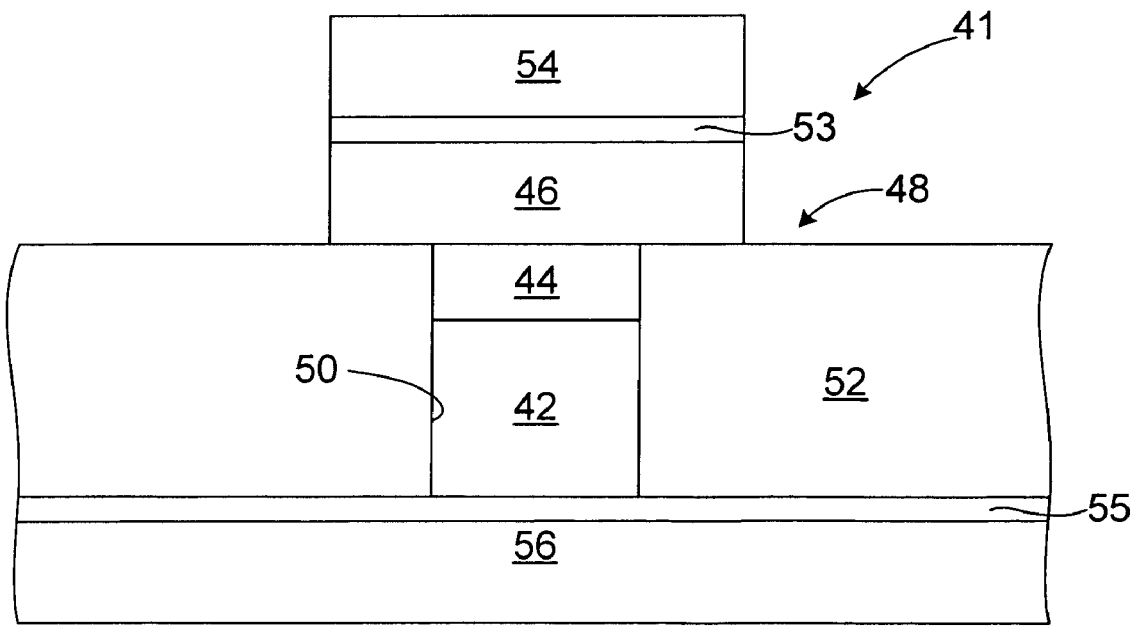
FIG. 4 illustrates a second embodiment of the invention.

An alternate embodiment is shown in FIG. 4. In this embodiment, similar to the embodiment of FIG. 3, the structure 41 includes an electrode 42, an insulating layer 44 on and in contact with the electrode 42, and an electrode 46 on and in contact with the insulating layer 44, so that insulating layer 44 lies between the electrodes 42, 46, the electrode 42, insulating layer 44 and electrode 46 forming a metal-insulator-metal (MIM) resistive memory device 48. The insulating layer 44 and electrode 42 are formed within an opening 50 in a dielectric layer 52, and the electrode 46 is formed over the insulating layer 44 and dielectric layer 52. The electrodes 42, 46 may be of any suitable conductive material as described above, while the insulating layer 44 may be of any suitable metal oxide as described above, which may be susceptible to reduction by $H_2$. Glue layers 53, 55 of for example TiN are provided, one glue layer 53 on and in contact with the electrode 46, the electrode 42 on and in contact with the glue layer 55. On and in contact with the glue layer is an $H_2$ gettering layer 54 of Ti. An additional $H_2$ gettering layer 56, also of Ti, is provided, with the glue layer 55 on and in contact with the gettering layer 56. The glue layers 53, 55, in the range of 300-1000 angstroms thick, and preferably in the range of 600-700 thick, promote adhesion of the gettering layers 54, 56. The gettering layers 54, 56 perform the same function as described above with relation to FIG. 3.

Figure 5:
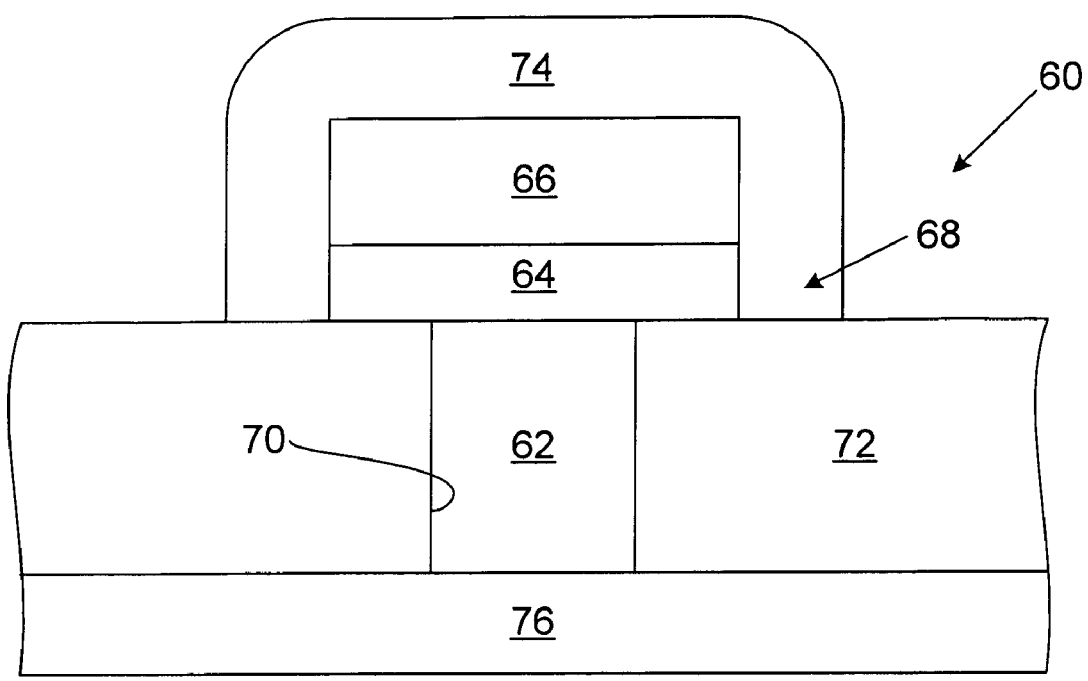
FIG. 5 illustrates a third embodiment of the invention.

FIG. 5 illustrates a third embodiment of the invention. In this embodiment, similar to the embodiments of FIG. 3 and 4, the structure 60 includes an electrode 62, an insulating layer 64 on and in contact with the electrode 62, and an electrode 66 on and in contact with the insulating layer 64, so that insulating layer 64 lies between the electrodes 62, 66, the electrode 62, insulating layer 64 and electrode 66 forming a metal-insulator-metal (MIM) resistive memory device 68. The electrode 62 is formed within an opening 70 in a dielectric layer 72, and the insulating layer 64 and electrode 66 are formed over the electrode 62 and dielectric layer 72. The electrodes 62, 66 may be of any suitable conductive material as set forth above, while the insulating layer 64 may be of any suitable thin metal oxide film as set forth above, which may be susceptible to reduction by $H_2$. At the top of the metal-insulator-metal device 68 on and in contact with the electrode 66 and the insulating layer 64 is an $H_2$ gettering layer 74 of Ti. The gettering layer 74 covers the top and sides of the electrode 66-insulating layer 64 stack, so that the gettering layer 74, along with the dielectric layer 72, provides encapsulation of the insulating layer 64, acting as a stop layer to provide additional protection of the insulating layer 64. At the bottom of the metal-insulator-metal device 68 is an additional $H_2$ gettering layer 76, also of Ti, with the electrode 52 on and in contact with that $H_2$ gettering layer 76.

Figure 6:
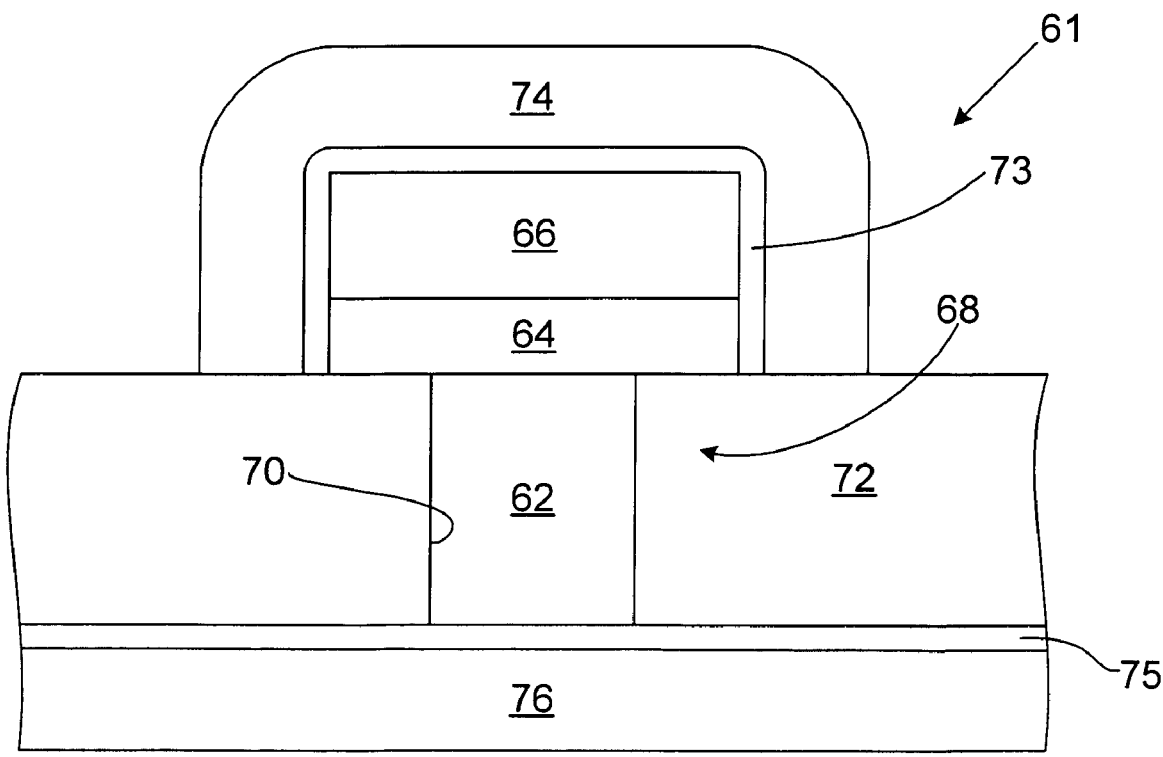
FIG. 6 illustrates a fourth embodiment of the invention.

FIG. 6 illustrates a fourth embodiment of the invention. In this embodiment, similar to the embodiments of FIGS. 3-5, the structure 61 includes an electrode 62, an insulating layer 64 on and in contact with the electrode 62, and an electrode 66 on and in contact with the insulating layer 64, so that insulating layer 64 lies between the electrodes 62, 66, the electrode 62, insulating layer 64 and electrode 66 forming a metal-insulator-metal (MIM) resistive memory device 68. The electrode 62 is formed within an opening 70 in a dielectric layer 72, and the insulating layer 64 and electrode 66 are formed over the electrode 62 and dielectric layer 72. The electrodes 62, 66 may be of any suitable conductive material as set forth above, while the insulating layer 64 may be of any suitable thin metal oxide film as set forth above, which may be susceptible to reduction by $H_2$. Glue layers 73, 75 of for example TiN are provided, one glue layer 73 on and in contact with the electrode 66, the electrode 62 on and in contact with the glue layer 75. On and in contact with the glue layer 73 is an $H_2$ gettering layer 74 of Ti. An additional $H_2$ gettering layer 76 of Ti is provided, with the glue layer 75 on and in contact with the gettering layer 76.

It will be understood that in each embodiment, if so chosen, only a single gettering layer, or more than two gettering layers, may be provided.

Metal-insulator-metal structures are also formed as capacitors with metal or nitrided metal electrodes (such as TaN or TiN) and a metal oxide (for example high-k metal oxide/metal oxide stack) therebetween, which metal oxide film(s) may be susceptible to reduction by $H_2$ in the manner described above. It will be seen that the above approach is equally advantageous with be metal-insulator-metal structure forming a capacitor.

In the present approach, the inclusion of the gettering layer or layers provides that reduction of the insulating layer is substantially avoided, in turn limiting degradation of the insulating layer to in turn avoid degradation in performance of the device which would occur upon such reduction.

FIG. 7 illustrates a system 200 utilizing memory devices as described above. As shown therein, the system 200 includes hand-held devices in the form of cell phones 202, which communicate through an intermediate apparatus such as a tower 204 (shown) and/or a satellite. Signals are provided from one cell phone to the other through the tower 204. Such a cell phone 202 with advantage uses memory devices of the type described above for data storage, for example names, telephone number and other data. One skilled in the art will readily understand the advantage of using such memory devices in other hand-held devices which utilize data storage, such as portable media players, personal digital assistants, digital cameras and the like.

FIG. 8 illustrates another system 300 utilizing memory devices as described above. The system 300 includes a vehicle 302 having an engine 304 controlled by an electronic control unit 306. The electronic control unit 306 with advantage uses memory devices of the type described above for data storage, for example data relating to engine and vehicle operating conditions.

Figure 9:
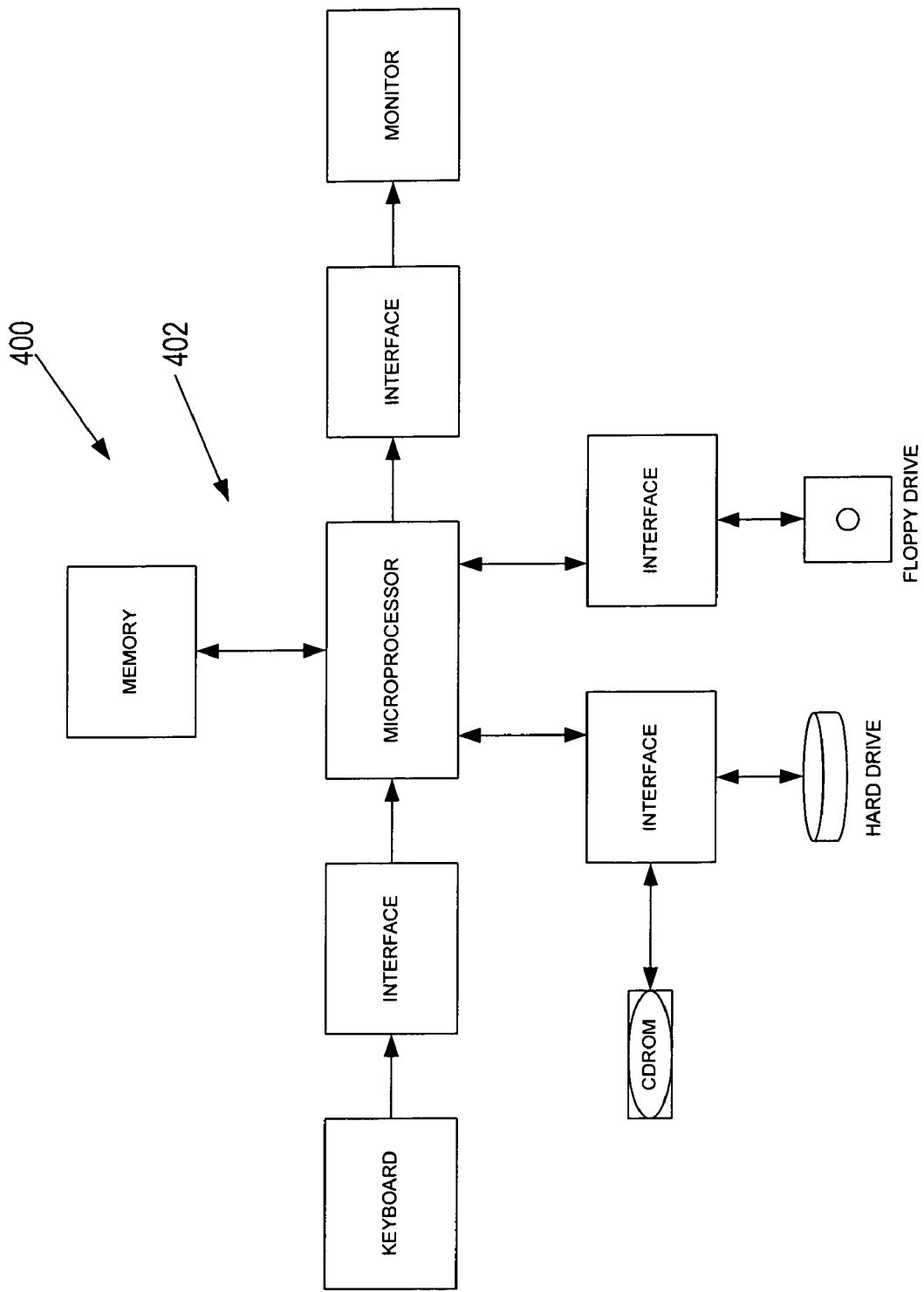

FIG. 9 illustrates yet another system 400 utilizing memory devices as described above. This system 400 is a computer 402 which includes an input in the form of a keyboard, and a microprocessor for receiving signals from the keyboard through an interface. The microprocessor also communicates with a CDROM drive, a hard drive, and a floppy drive through interfaces. Output from the microprocessor is provided to a monitor through an interface. Also connected to and communicating with the microprocessor is memory which may take the form of ROM, RAM, flash and/or other forms of memory.

The memory with advantage uses memory devices of the type described above for storage of any data which is of use.

The foregoing description of the embodiments of the invention has been presented for purposes of illustration and description. It is not intended to be exhaustive or to limit the invention to the precise form disclosed. Other modifications or variations are possible in light of the above teachings.

The embodiments were chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. An electronic device comprising:
a first electrode;
a second electrode;
an insulating layer between and in direct contact with the first and second electrodes, wherein the insulating layer comprises an oxide layer, wherein the second electrode and the insulating layer are formed in an opening in a dielectric layer, and wherein the first electrode is above and in contact with the dielectric layer; and
a first and second protective body for substantially avoiding reduction of the insulating layer;
further comprising a first glue layer in direct contact with the first electrode, and a second glue layer in direct contact with the second electrode, the first protective body being in contact with the first glue layer, and the second protective body being in contact with the second glue layer.

2. The electronic device of claim 1 wherein the first and second protective body are gettering layers which capture a reducing agent.

3. The electronic device of claim 1 wherein the insulating layer may be reduced by $H_2$, and the first and second protective layers capture $H_2$.

4. The electronic device of claim 1 wherein the electronic device is a capacitor.

5. The electronic device of claim 1 wherein the electronic device is a memory device.

6. An electronic device comprising:
a first electrode;
a second electrode;
an oxide layer between the first and second electrodes, which oxide layer may be reduced by $H_2$, wherein the second electrode is formed within an opening in a dielectric layer; and wherein the oxide layer is above and in contact with the dielectric layer and
a gettering layer on and in contact with the first electrode covering the top and sides of the first electrode and oxide layer, the gettering layer acting as a protective layer for substantially avoiding reduction of the oxide layer by capturing $H_2$.

7. The electronic device of claim 6 wherein the gettering layer comprises Ti.

8. The electronic device of claim 6 wherein the electronic device is a capacitor.

9. The electronic device of claim 6 wherein the electronic device is a memory device.

10. An electronic device comprising:
a first electrode;
a second electrode;
an oxide layer between and in direct contact with the first and second electrodes, which oxide layer may be reduced by $H_2$, wherein the second electrode and the oxide layer are formed in an opening in a dielectric layer, and wherein the first electrode is above and in contact with the dielectric layer;
a first glue layer on and in direct contact with the first electrode, and a second glue layer on and in direct contact with the second electrode; and
a first gettering layer on and in contact with the first glue layer, and a second gettering layer on and in contact with the second glue layer, the first and second gettering layers acting as protective layers for substantially avoiding reduction of the oxide layer by capturing $H_2$.

11. The electronic device of claim 10 wherein the first and second gettering layers comprise Ti.

12. The electronic device of claim 10 wherein the electronic device is a capacitor.

13. The electronic device of claim 10 wherein the electronic device is a memory device.

14. The electronic device of claim 1 and further comprising said device incorporated in a system.

15. The electronic device of claim 14 wherein the system is selected from the group consisting of a hand-held device, a vehicle, and a computer.

* * * * *